(12) United States Patent
Hong et al.

(10) Patent No.: US 12,426,521 B2
(45) Date of Patent: Sep. 23, 2025

(54) SELECTOR DEVICE COMPRISING POLYCRYSTALLINE METAL OXIDE LAYER AND CROSS-POINT MEMORY COMPRISING SAME

(71) Applicant: Industry-University Cooperation Foundation Hanyang University, Seoul (KR)

(72) Inventors: Jin Pyo Hong, Seoul (KR); Gabriel Jang, Seoul (KR)

(73) Assignee: Industry-University Cooperation Foundation Hanyang University, Seoul (KR)

( * ) Notice: Subject to any disclaimer, the term of this patent is extended or adjusted under 35 U.S.C. 154(b) by 727 days.

(21) Appl. No.: 17/426,033

(22) PCT Filed: Jan. 29, 2020

(86) PCT No.: PCT/KR2020/001330
§ 371 (c)(1),
(2) Date: Jul. 27, 2021

(87) PCT Pub. No.: WO2020/159214
PCT Pub. Date: Aug. 6, 2020

(65) Prior Publication Data
US 2022/0165950 A1   May 26, 2022

(30) Foreign Application Priority Data
Jan. 29, 2019 (KR) .................. 10-2019-0010998
Jan. 28, 2020 (KR) .................. 10-2020-0010122

(51) Int. Cl.
*H10N 70/00* (2023.01)
*H10B 63/00* (2023.01)

(52) U.S. Cl.
CPC ......... *H10N 70/8833* (2023.02); *H10B 63/80* (2023.02); *H10N 70/841* (2023.02); *H10N 70/8613* (2023.02)

(58) Field of Classification Search
None
See application file for complete search history.

(56) References Cited

U.S. PATENT DOCUMENTS

| 10,580,979 B2 | 3/2020 | Park et al. |
| 2003/0155602 A1 | 8/2003 | Krieger et al. |

(Continued)

FOREIGN PATENT DOCUMENTS

| KR | 10-2014-0020636 A | 2/2014 |
| KR | 10-1537715 B1 | 7/2015 |

(Continued)

OTHER PUBLICATIONS

International Search Report of PCT/KR2020/001330 dated May 12, 2020 [PCT/ISA/210].

*Primary Examiner* — Sue A Purvis
*Assistant Examiner* — Seyon Ali-Simah Punchbeddell
(74) *Attorney, Agent, or Firm* — Sughrue Mion, PLLC

(57) ABSTRACT

A selection device and a crosspoint memory including the same are provided. The selection device has a lower electrode. A polycrystalline metal oxide layer including insulating crystal grains and a conductive nanochannel formed in a grain boundary between the crystal grains is disposed on the lower electrode. An upper electrode is disposed on the polycrystalline metal oxide layer.

1 Claim, 11 Drawing Sheets

(56) References Cited

U.S. PATENT DOCUMENTS

| | | | |
|---|---|---|---|
| 2009/0026441 A1 | 1/2009 | Cheung et al. | |
| 2010/0276658 A1 | 11/2010 | Chien et al. | |
| 2012/0193597 A1* | 8/2012 | Shingu | H10N 70/8418 |
| | | | 257/E27.017 |
| 2016/0043142 A1* | 2/2016 | Hong | H10N 70/24 |
| | | | 257/421 |
| 2016/0225824 A1* | 8/2016 | Jo | H10N 70/883 |
| 2018/0219154 A1* | 8/2018 | Majhi | H10N 70/8833 |
| 2018/0269390 A1* | 9/2018 | Saitoh | H10N 70/8416 |
| 2018/0277753 A1* | 9/2018 | Yamamoto | H10N 70/884 |
| 2019/0123273 A1* | 4/2019 | Lee | H10N 70/883 |
| 2019/0296234 A1* | 9/2019 | Yoshimura | H10B 63/845 |

FOREIGN PATENT DOCUMENTS

| | | |
|---|---|---|
| KR | 10-2017-0059974 A | 5/2017 |
| KR | 10-2017-0099216 A | 8/2017 |
| WO | 2015/160092 A3 | 10/2015 |
| WO | 2016/048327 A1 | 3/2016 |

\* cited by examiner anneal

Comparative Example 2

Preparation Example 5

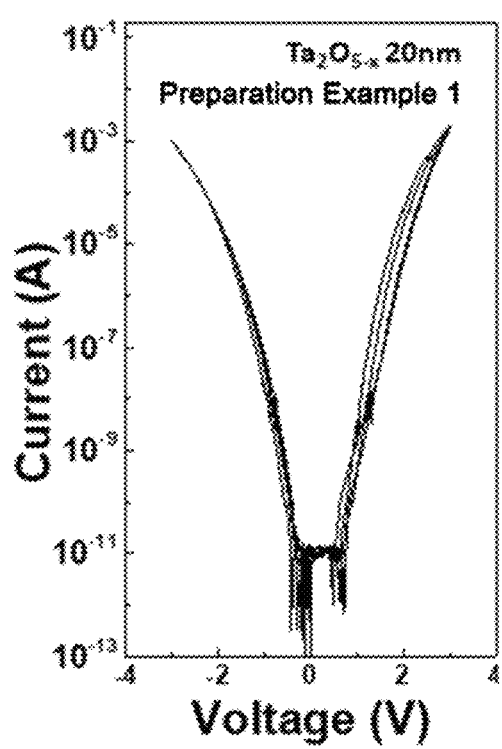

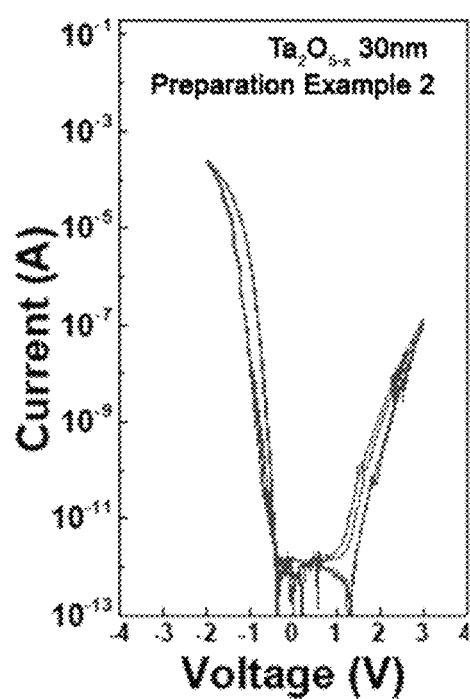

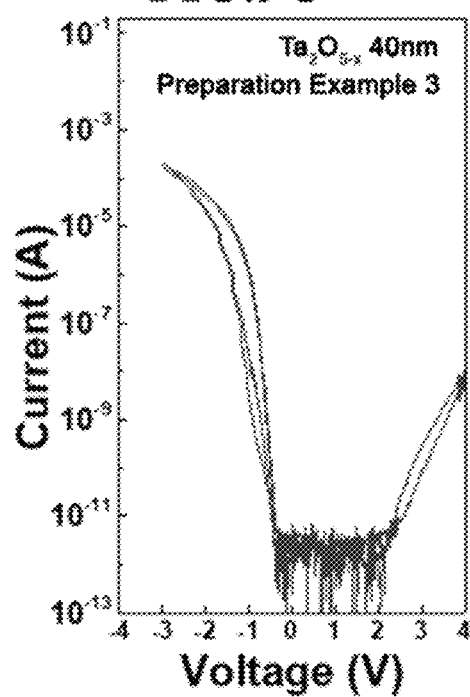

SELECTOR DEVICE COMPRISING POLYCRYSTALLINE METAL OXIDE LAYER AND CROSS-POINT MEMORY COMPRISING SAME

CROSS REFERENCE TO RELATED APPLICATIONS

This application is a National Stage of International Application No. PCT/KR2020/001330 filed on Jan. 29, 2020, claiming priority based on Korean Patent Application No. 10-2019-0010998 filed on Jan. 29, 2019 and Korean Patent Application No. 10-2020-0010122 filed on Jan. 28, 2020.

TECHNICAL FIELD

The present invention relates to a semiconductor device, and more particularly, to a selection device and a cross-point memory including the same.

BACKGROUND ART

In the case of a flash memory that is currently commercialized as a non-volatile memory, a change in threshold voltage due to storage or removal of charges in a charge storage layer is used. The charge storage layer may be a floating gate made of a polysilicon layer or a charge trap layer made of a silicon nitride layer. Recently, new next-generation non-volatile memory devices with lower power consumption and higher integration than the flash memory devices are being studied. Examples of the next-generation nonvolatile memory devices include a phase change RAM (PRAM), a magnetic RAM (MRAM), and a resistance change RAM (ReRAM).

Meanwhile, in order to configure a cell array using such a memory device, a transistor electrically connected to the memory device and functioning as a switch may be required. However, configuring a memory device array together with such transistors may be greatly disadvantageous in terms of integration.

DISCLOSURE

Technical Problem

Accordingly, an object of the present invention is to provide a switching device or a selection device that may not adversely affect the degree of integration, and a three-dimensional cross-point memory having the same.

The objects of the present invention are not limited to the above-mentioned objects, and other objects not mentioned will be clearly understood by those skilled in the art from the following description.

Technical Solution

One aspect of the present invention provides a selection device. The selection device comprises a lower electrode. A polycrystalline metal oxide layer including insulating crystal grains and conductive nanochannels formed in grain boundaries between the grains is disposed on the lower electrode. An upper electrode is disposed on the polycrystalline metal oxide layer.

The crystal grains may be crystal grains of a metal oxide represented by the following Formula 1:

$$M_xO_y \quad \text{[Formula 1]}$$

In Formula 1, M may be a metal, and x and y may be stoichiometric integers. Specifically, M may be a transition metal, a post-transition metal, a metalloid, Mg, or a combination thereof. The crystal grains may be $Ta_2O_5$, $TiO_2$, $Nb_2O_5$, $WO_2$, $HfO_2$, $ZnO$, $MoO_2$, $CoO$, $Cu_2O_3$, $AgO$, $CrO_2$, $Al_2O_3$, $Ga_2O_3$, $SiO_2$, $MgO$, or a combination thereof.

The nanochannels may be metal oxide which is rich in metal compared to the metal oxide in the crystal grains. Specifically, the nanochannels may be metal oxide represented by the following formula 2:

$$M_xO_{y-z} \quad \text{[Formula 2]}$$

In Formula 2, M, x and y may be the same as in Formula 1, and z may be greater than 0 and 1 or less. The nanochannel may be $Ta_2O_{5-z}$, $TiO_{2-z}$, $Nb_2O_{5-z}$, $WO_{2-z}$, $HfO_{2-z}$, $Z_nO_{1-z}$, $MoO_{2-z}$, $CoO_{1-z}$, $Cu_2O_{3-z}$, $AgO_{1-z}$, $CrO_{2-z}$, $Al_2O_{3-z}$, $Ga_2O_{3-z}$, $SiO_{2-z}$, $MgO_{1-z}$, or a combination thereof.

In one example, the lower electrode may include an inert metal layer or a metal compound layer which is inert. In another example, the lower electrode may be a metal layer having the same metal as a metal included in the metal oxide layer, and a diffusion control layer may be provided on the metal layer. The diffusion control layer may be an inert metal layer or a metal compound layer which is inert, The upper electrode may be a film of the same metal as a metal in the metal oxide layer or an inert metal film.

Another aspect of the present invention provides a selection device. The selection device comprises a lower electrode. A polycrystalline metal oxide layer is disposed on the lower electrode. The polycrystalline metal oxide layer includes a plurality of metal oxide crystal grains and a crystal grain boundary in which a metal oxide nanochannel is formed between the crystal grains. The metal oxide nanochannel is rich in metal compared to the metal oxide in the crystal grain. An upper electrode is disposed on the polycrystalline metal oxide layer.

Still another aspect of the present invention provides a method for manufacturing a selection device. The method comprises sequentially forming a metal layer, a diffusion control layer, and a metal oxide layer on a substrate. The metal layer is a layer of the same metal as a metal included in the metal oxide layer. The substrate on which the metal oxide layer is formed is heat-treated in an inert gas atmosphere to crystallize the metal oxide layer to obtain a polycrystalline layer having a plurality of crystal grains and a grain boundary therebetween, and to diffuse the metal in the metal layer through the diffusion control layer into the grain boundary. An upper electrode is formed on the heat-treated metal oxide layer.

Still another aspect of the present invention provides a crosspoint memory. The crosspoint memory comprises a plurality of first wirings arranged in parallel in one direction. A plurality of second wirings intersecting the first wirings and arranged parallel to each other are disposed on the first wirings. A selection element and a memory element arranged in a stacked order are disposed between the first wiring and the second wiring in each portion where the first wirings and the second wirings intersect. The selection element is a polycrystalline metal oxide layer including insulating grains and conductive nanochannels formed in grain boundaries between the grains.

An intermediate electrode may be disposed between the selection element and the memory element. The memory element may be a phase change memory layer, a resistive change memory layer, or a magnetoresistive memory layer.

Advantageous Effects

As described above, the selection device according to an embodiment of the present invention is a two-terminal device having only two electrodes, an upper electrode and a lower electrode, and does not occupy a large area, so that the degree of integration can be improved. In addition, since such a selection device may exhibit a bidirectional selection characteristic, it may be applicable as a selection device of a bidirectional memory device. Additionally, a conductive nanochannel is formed only within the grain boundary of the polycrystalline metal oxide layer to exhibit low off-current.

However, the effects of the present invention are not limited to the above-mentioned effects, and other effects not mentioned will be clearly understood by those skilled in the art from the following description.

DESCRIPTION OF DRAWINGS

FIGS. 9A, 9B, and 9C are graphs illustrating I-V characteristics of selection devices including polycrystalline $Ta_2O_5$ layers according to Preparation Examples 1 to 3, respectively.

MODES OF THE INVENTION

Figure 1A:
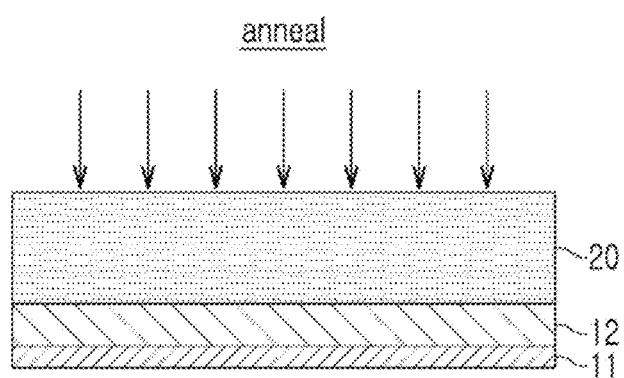
FIGS. 1A and 1B are cross-sectional views sequentially illustrating a method of manufacturing a selection device according to an embodiment of the present invention.

While the present invention is susceptible to various modifications and alternative forms, specific embodiments thereof are shown by way of example in the drawings and will herein be described in detail. However, the description is not intended to limit the present disclosure to the specific exemplary embodiments, and it is to be understood that all the changes, equivalents, and substitutions belonging to the spirit and technical scope of the present disclosure are included in the present disclosure. In the drawings, where a layer is said to be "on" another layer or substrate, it may be formed directly on the other layer or substrate, or a third layer may be interposed therebetween.

Figure 1B:
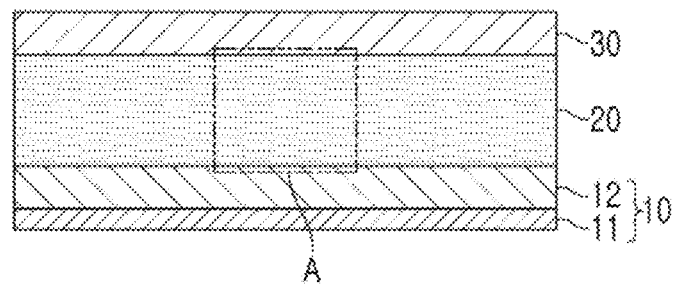

FIGS. 1A and 1B are cross-sectional views sequentially illustrating a method of manufacturing a selection device according to an embodiment of the present invention.

Referring to FIG. 1A, a substrate (not shown) may be provided. The substrate may be a semiconductor, metal, glass or polymer substrate.

A metal layer 11 may be formed on the substrate. The metal layer 11 may be formed to a thickness of 1 nm to 50 nm. Before forming the metal layer 11, an insulating layer (not shown) may be additionally formed on the substrate.

A diffusion control layer 12 may be formed on the metal layer 11. The diffusion control layer 12 may contain an inert metal, an inert metal-compound, or a combination thereof, and thus may have a very low possibility of chemical reaction with a layer in contact with the diffusion control layer 12. The inert metal may include Ru (ruthenium), Rh (rhodium), Pd (palladium), Os (osmium), Ir (iridium), Pt (platinum), Au (gold), or a combination thereof. The inert metal-compound layer may be WN. The thickness of the diffusion control layer 12 may have a nanometer size. As an example, the thickness of the diffusion control layer 12 may be 10 to 100 nm, specifically 15 to 60 nm.

In addition, a metal oxide layer 20 may be formed on the diffusion control layer 12. The metal oxide layer 20 may be a binary metal oxide of metal and oxygen. This metal oxide layer 20 may be in an amorphous state immediately after being formed and may be an insulator. The metal oxide included in the metal oxide layer 20 may be expressed by the following Chemical Formula 1 below:

   [Chemical Formula 1]

In Chemical Formula 1, M is a metal, and x and y are integers satisfying stoichiometry.

M may be a transition metal, a post-transition metal, a metalloid, Mg, or a combination thereof. The transition metal may be, for example, Ta, Ti, Nb, W, Hf, Zn, Mo, Co, Cu, Ag, or Cr, and the post-transition metal may be, for example, Al or Ga, and the metalloid may be Si.

As an example, the metal oxide expressed by Chemical Formula 1 may include a transition metal oxide such as $Ta_2O_5$, $TiO_2$, $Nb_2O_5$, $WO_2$, $HfO_2$, $ZnO$, $MoO_2$, $CoO$, $Cu_2O_3$, $AgO$, or $CrO_2$; a post-transition metal oxide such as $Al_2O_3$ or $Ga_2O_3$; a metalloid oxide such as $SiO_2$; or $MgO$.

Meanwhile, the metal layer 11 may be a layer of the same metal as the metal included in the metal oxide layer 20. Specifically, when the metal oxide layer 20 is a $Ta_2O_5$ layer, the metal layer 11 may be a Ta layer, and when the metal oxide layer 20 is an $HfO_2$ layer, the metal layer 11 may be an Hf layer.

The substrate on which the metal oxide layer 20 is formed may be annealed. The annealing or heat-treatment may be performed in a temperature range in which crystallization of the metal oxide layer 20 is possible and metals in the metal layer 11, specifically metal atoms or metal ions, can be diffused into the metal oxide layer 20 through the diffusion control layer 12. As an example, the annealing temperature may vary depending on the metal oxide material used. For example, when the metal layer is a Ta layer, the annealing may be performed at 500 to 1000° C., and when the metal layer is a Hf layer, the annealing may be performed at 350 to 550° C. The annealing may be performed in an inert gas atmosphere, for example, argon, nitrogen, or a combination thereof.

The metal layer 11, the diffusion control layer 12, and the metal oxide layer 20 may be formed by a physical vapor deposition method such as sputtering or evaporation; or a chemical vapor deposition method, regardless of each other. The annealing may be rapid thermal annealing (RTA) or heat treatment using a furnace.

Figure 2:
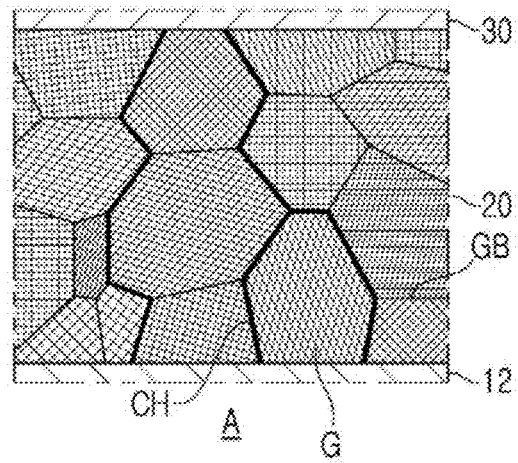
FIG. 2 is an enlarged cross-sectional view of part A of FIG. 1B.

FIG. 2 is an enlarged cross-sectional view of part A of FIG. 1B.

Referring to FIGS. 1B and 2, during the annealing process, the metal oxide layer 20 may be crystallized and changed into a polycrystalline layer. Here, the polycrystalline layer may mean a layer including a plurality of crystal grains G having various sizes and various crystal directions, and a grain boundary GB may be formed between the plurality of crystal grains G. Since the crystal grains G may have the composition of Chemical Formula 1, they may be in an insulating state.

Meanwhile, in the annealing process, the metal in the metal layer 11 diffused into the metal oxide layer 20 through the diffusion control layer 12 may be mainly diffused into the grain boundary GB to form a nanochannel CH. In this case, the nanochannel CH may include a metal oxide in a metal-rich state, that is, in an oxygen-deficient state. In other words, the nanochannel CH may include a metal oxide in a state having oxygen vacancies, for example, a metal oxide represented by Chemical Formula 2.

$$M_xO_{y-z} \qquad \text{[Chemical Formula 2]}$$

In Chemical Formula 2, M, x and y may be the same as in Chemical Formula 1, and z may be greater than 0 and less than or equal to 1.

The metal oxide in the nanochannel CH is, for example, a transition metal oxide such as $Ta_2O_{5-z}$, $TiO_{2-z}$, $Nb_2O_{5-z}$, $WO_{2-z}$, $HfO_{2-z}$, $ZnO_{1-z}$, $MoO_{2-z}$, $CoO_{1-z}$, $Cu_2O_{3-z}$, $AgO_{1-z}$ or $CrO_{2-z}$; a post-transition metal oxide such as $Al_2O_{3-z}$ or $Ga_2O_{3-z}$; a metalloid oxide such as $SiO_{2-z}$; $MgO_{1-z}$; or a combination thereof.

As described above, the metal may be diffused into the grain boundary GB at the same time that the metal oxide layer 20 is crystallized. Alternatively, after the metal is diffused in the metal oxide layer 20, the metal diffused in the metal oxide layer 20 may promote crystallization to form crystal grains G and the diffused metal may exist in the grain boundary GB.

As described above, the metal oxide in the grain boundary GB, that is, the nanochannel CH, may be a metal oxide in a state having oxygen vacancies, and thus may exhibit conductivity.

Thereafter, the upper electrode 30 may be formed on the metal oxide layer 20. The upper electrode 30 is a conductive film, and may be a metal layer that is the same as or not the same as the metal in the metal oxide layer 20, or an inert metal layer. As an example, when the metal oxide layer 20 is a $Ta_2O_5$ layer, the upper electrode 30 may be a Ta layer, and when the metal oxide layer 20 is an $HfO_2$ layer, the upper electrode 30 may be a Ta layer. When the upper electrode 30 is an inert metal layer, the upper electrode 30 may be a layer including, for example, Ru (ruthenium), Rh (rhodium), Pd (palladium), Os (osmium), Ir (iridium), Pt (platinum), Au (gold), or a combination thereof. The upper electrode 30 may be formed using a physical vapor deposition method such as sputtering or evaporation; or a chemical vapor deposition method.

The metal layer 11 and/or the diffusion control layer 12 may serve as a lower electrode 10 (or a first wiring shown in FIG. 3) to which an external voltage is applied. In one example, when the diffusion control layer 12 functions as a lower electrode (or the first wiring shown in FIG. 3), the metal layer 11 may be a layer disposed under the lower electrode for each unit cell. In another example, when the metal layer 11 serves as the lower electrode (or the first wiring shown in FIG. 3), the diffusion control layer 12 may be a layer disposed on the lower electrode for each unit cell. In another example, both the metal layer 11 and the diffusion control layer 12 may serve as the lower electrode (or the first wiring shown in FIG. 3).

Figure 3:
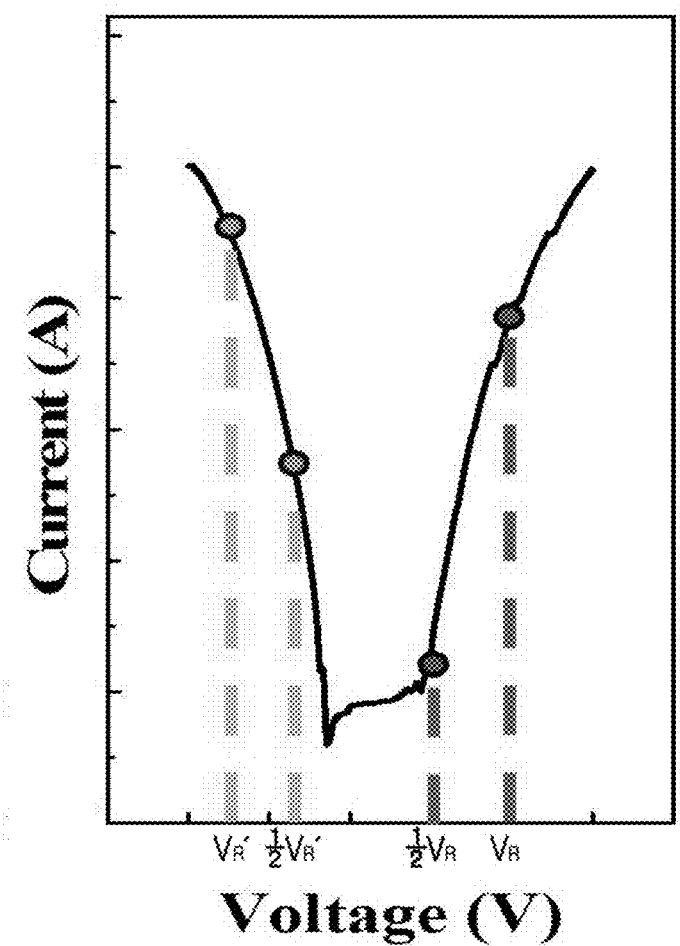
FIG. 3 is a schematic diagram illustrating an I-V curve of the selection device described with reference to FIGS. 1A, 1B, and 2.

FIG. 3 is a schematic diagram illustrating an I-V curve of the selection device described with reference to FIGS. 1A, 1B, and 2.

Referring to FIG. 1B and FIG. 3, when a positive voltage is applied to the upper electrode 30 with respect to the lower electrode 10 of the selection device, the selection device may be turned on at a specific positive threshold voltage. In addition, when a negative voltage is applied to the upper electrode 30 with respect to the lower electrode 10, the selection device may be turned on at a specific negative threshold voltage. Also, after being turned on, the current tends to increase linearly. As such, the selection element may exhibit a bipolar characteristic. This is because the nanochannel CH formed in the grain boundary GB of the selection device exhibits low conductivity in a low electric field, but exhibits high conductivity in a high electric field.

This selection device is a two-terminal device having only two electrodes, an upper electrode and a lower electrode, and does not occupy a large area, so that the degree of integration can be improved. In addition, since such a selection device may exhibit bidirectional selection characteristics, it may be applicable as a selection device of a bidirectional memory device. In particular, when the selection device is applied to the crosspoint memory as shown in FIG. 4, it can be predicted that a large difference between the current values at the read voltage (VR or VR) and the ½ read voltage (½VR or ½VR) are induced, thereby significantly increasing the read margin.

Additionally, it is possible to form a conductive nanochannel at a low voltage by being confined within the grain boundary of the polycrystalline metal oxide film, thereby exhibiting a low off-current.

Figure 4:
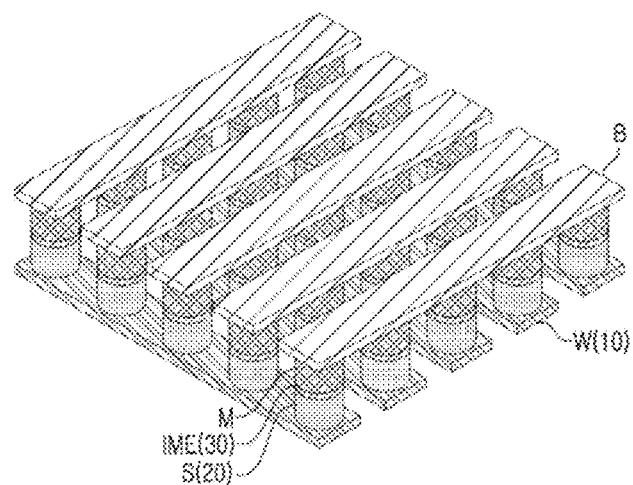
FIG. 4 is a schematic diagram illustrating a three-dimensional crosspoint memory array according to an embodiment of the present invention.

FIG. 4 is a schematic diagram illustrating a three-dimensional crosspoint memory array according to an embodiment of the present invention.

Referring to FIG. 4, a plurality of first wirings, for example, word lines W may be disposed on a substrate. The word lines W may be disposed parallel to each other in one direction. A plurality of second wirings intersecting the word lines W and arranged parallel to each other, for example, bit lines B may be positioned on the word lines W.

At each portion where the word lines W and the bit lines B intersect, a selection element S and a memory element M may be stacked therebetween. An intermediate electrode IME may be arranged between the selection element S and the memory element M.

The selection element S may be the metal oxide layer 20 described with reference to FIGS. 1B and 2. The word lines W may be the lower electrodes 10 described with reference to FIG. 1B. Also, the intermediate electrode IME may be the upper electrode 30 described with reference to FIG. 1B.

The memory element M is a non-volatile memory element, for example, a phase change random access memory (PRAM) layer, a magnetoresistive random access memory (MRAM) layer, or a resistive random access memory (ReRAM) layer.

When the memory element M is the phase change memory layer, the memory element M may include a chalcogenide material, for example, Ge—Te, Ge—Sb—Te, Ge—Te—Se, Ge—Te—As, Ge—Te—Sn, Ge—Te—Ti, Ge—Bi—Te, Ge—Cu—Te, Si—Sb—Te, Ge—Sn—Sb—Te, Ge—Sb—Se—Te, Ge—Sb—Te—S, Ge—Te—Sn—O, Ge—Te—Sn—Au, Ge—Te—Sn—Pd, Sb—Te, Se—Te—Sn, Sb—Se—Bi, In—Se, or In—Sb—Te.

When the memory element M is the magnetoresistive memory layer, specifically, a spin transfer torque MRAM layer, the memory element M may include a magnetic tunnel junction (MTJ) structure. The MTJ structure may include a ferromagnetic pinned layer (not shown), a tunnel barrier layer (not shown), and a ferromagnetic free layer (not shown) sequentially stacked. The MTJ structure may further include a pinning layer (not shown) under the pinned layer. The pinned layer is a layer in which magnetization reversal does not occur and may be a CoFeB or FePt layer. The tunnel barrier layer may be an aluminum oxide layer or a magnesium oxide layer. The free layer is a layer in which magnetization reversal occurs above a critical current density and may be a CoFeB or FePt layer.

When the memory element M is the resistance change memory layer, the memory element M is a bipolar variable resistor layer, specifically, a resistance change memory layer having a bipolar characteristic, for example, a transition metal oxide layer, a chalcogenide layer, a perovskite layer, or a metal-doped solid electrolyte layer. The transition metal oxide layer may be $HfO_{2-x}$, $MnO_{2-x}$, $ZrO_{2-x}$, $Y_2O_{3-x}$, $TiO_{2-x}$, $NiO_{1-y}$, $Nb_2O_{5-x}$, $Ta_2O_{5-x}$, $CuO_{1-y}$, $Fe_2O_{3-x}$ (for example, $0 \leq x \leq 1.5$, $0 \leq y \leq 0.5$) or a lanthanoids oxide layer. The lanthanoid may be La (Lanthanum), Ce (Cerium), Pr (Praseodymium), Nd (Neodymium), Sm (Samarium), Gd (Gadolinium), or Dy (Dysprosium). The chalcogenide layer may be a GeSbTe layer, GeTeO (e.g., $Ge_2Te_2O_5$) layer. The perovskite layer may be a $SrTiO_3$ layer, a $SrZrO_3$ layer doped with Cr or Nb, a PCMO ($Pr_{1-X}Ca_XMnO_3$, $0<X<1$) layer, or LCMO ($La_{1-X}Ca_XMnO_3$, $0<X<1$, for example, X is 0.3) layer. The metal-doped solid electrolyte layer may be a layer in which Ag is doped in GeSe, that is, an AgGeSe layer.

The bit line B may be appropriately selected according to the memory element M among known conductive patterns.

Hereinafter, preferred examples are provided to aid the understanding of the present invention. However, the following experimental example is only for helping understanding of the present invention, and the present invention is not limited by the following experimental example.

<Device Including $Ta_2O_5$ Film>

Preparation Example 1

A Ta layer was formed to about 10 nm by sputtering on a silicon substrate on which a silicon oxide film was formed, and a Pt layer as a diffusion control layer was formed on the Ta layer by sputtering to a thickness of about 50 nm, and a $Ta_2O_5$ layer as a metal oxide layer was formed on the Pt layer by sputtering to a thickness of about 20 nm. The substrate on which the $Ta_2O_5$ layer was formed was heated to 700° C. for 30 minutes and then maintained for about 1 hour to perform heat treatment in an Ar atmosphere. After that, it was cooled naturally. A Ta layer with a thickness of about 20 nm was formed on the heat-treated $Ta_2O_5$ layer by sputtering to prepare a selection device.

Preparation Example 2

A selection device was prepared in the same manner as in Preparation Example 1, except that the $Ta_2O_5$ layer was formed to a thickness of about 30 nm.

Preparation Example 3

A selection device was prepared in the same manner as in Preparation Example 1, except that the $Ta_2O_5$ layer was formed to a thickness of about 40 nm.

Preparation Examples 4-6

Selection devices were prepared in the same manner as in Preparation Example 1, except that the $Ta_2O_5$ layer was formed to a thickness of about 150 nm and the substrate on which the $Ta_2O_5$ layer was formed was heat-treated at 600° C. (Preparation Example 4), 700° C. (Preparation Example 5), or 800° C. (Preparation Example 6).

Comparative Example 1

A selection device was prepared in the same manner as in Preparation Example 1, except that the $Ta_2O_5$ layer was not heat-treated and a Ta layer was formed on the non-heat-treated $Ta_2O_5$ layer.

Comparative Example 2

A selection device was prepared in the same manner as in Comparative Example 1, except that the $Ta_2O_5$ layer was formed to a thickness of about 150 nm.

TABLE 1

|  | $Ta_2O_5$ layer Thickness | Heat Treatment Temperature |
|---|---|---|
| Preparation Example 1 | 20 nm | 700° C. |
| Preparation Example 2 | 30 nm | 700° C. |
| Preparation Example 3 | 40 nm | 700° C. |
| Preparation Example 4 | 150 nm | 600° C. |
| Preparation Example 5 | 150 nm | 700° C. |
| Preparation Example 6 | 150 nm | 800° C. |
| Comparative Example 1 | 20 nm | — |
| Comparative Example 2 | 150 nm | — |

Figure 5:
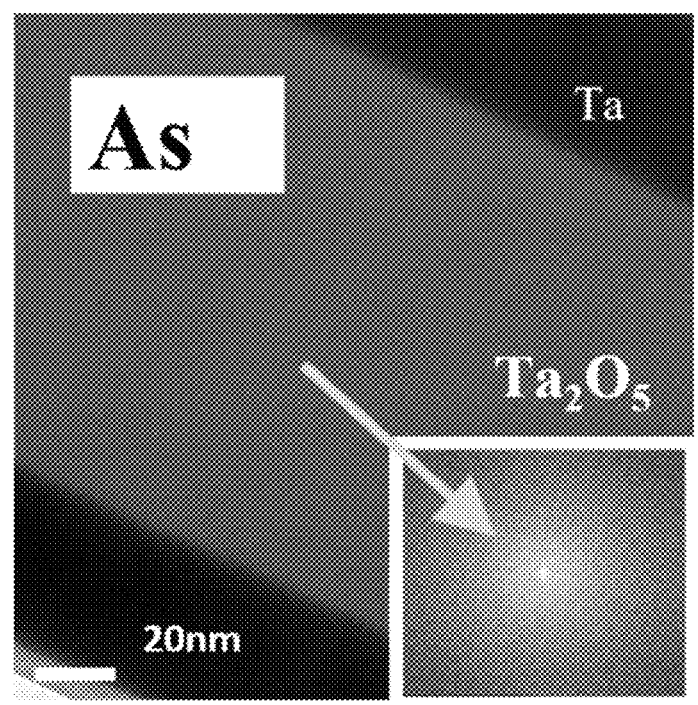
FIG. 5 shows a transmission electron microscopy (TEM) image and a selected area electron diffraction (SAED) pattern of a cross-section of a $Ta_2O_5$ layer of a device according to Comparative Example 2.
Figure 6:
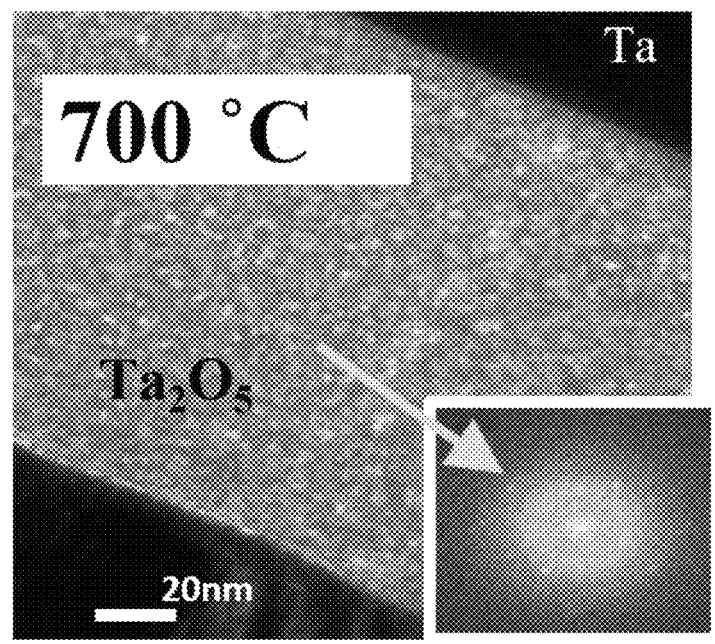
FIG. 6 shows a TEM image and a selected area electron diffraction pattern of a cross-section of a $Ta_2O_5$ layer of the device according to Preparation Example 5.

FIG. 5 shows a transmission electron microscopy (TEM) image and a selected area electron diffraction (SAED) pattern of a cross-section of a $Ta_2O_5$ layer of a device according to Comparative Example 2. FIG. 6 shows a TEM image and a selected area electron diffraction pattern of a cross-section of a $Ta_2O_5$ layer of the device according to Preparation Example 5.

Referring to FIGS. 5 and 6, it can be seen that the non-heat-treated $Ta_2O_5$ layer in the device according to Comparative Example 1 is an amorphous film, whereas the heat-treated $Ta_2O_5$ layer in the device according to Preparation Example 5 is a polycrystalline film.

Figure 7:
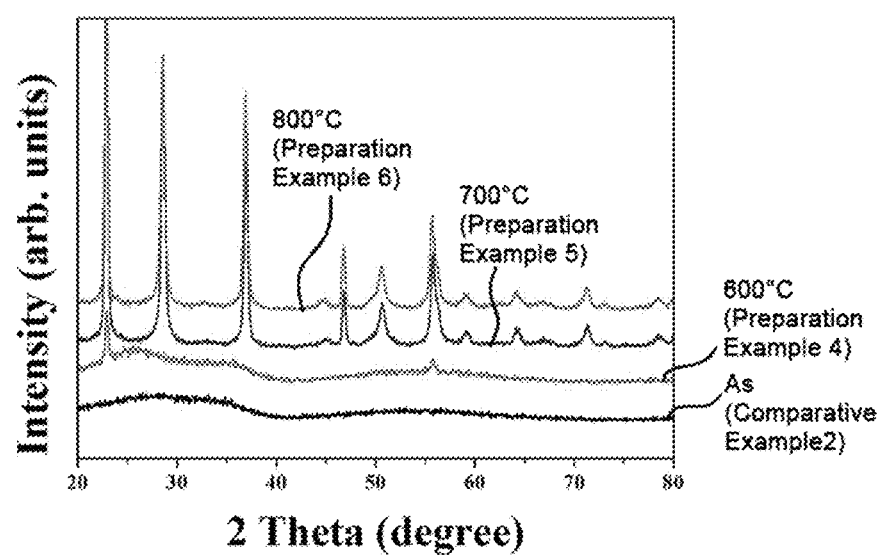
FIG. 7 is an X-ray diffraction (XRD) graph of $Ta_2O_5$ layers obtained in device preparation processes according to Preparation Examples 4 to 6 and Comparative Example 2.

FIG. 7 is an X-ray diffraction (XRD) graph of $Ta_2O_5$ layers obtained in device preparation processes according to Preparation Examples 4 to 6 and Comparative Example 2.

Referring to FIG. 7, the $Ta_2O_5$ layer that was not heat treated appeared as an amorphous film (Comparative Example 2), crystallization of the $Ta_2O_5$ layer started when heat treated at 600° C. (Preparation Example 4), and a polycrystalline structure was formed in the $Ta_2O_5$ layer when heat treated at 700° C. or higher (Preparation Example 5, Preparation Example 5).

Figure 8:
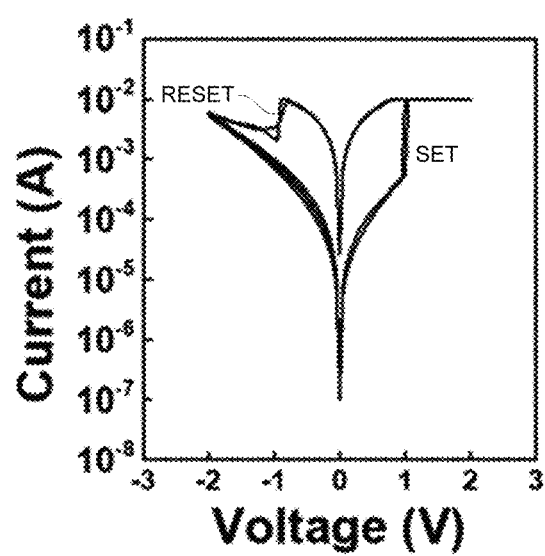
FIG. 8 is a graph showing I-V characteristics of a device including a $Ta_2O_5$ layer, which is an amorphous insulating layer that is not heat treated according to Comparative Example 1.

FIG. 8 is a graph showing I-V characteristics of a device including a $Ta_2O_5$ layer, which is an amorphous insulating layer that is not heat treated according to Comparative Example 1.

Referring to FIG. 8, when a positive voltage is applied to the device according to Comparative Example 1, it is set at about 1.2V to show a low resistance state, and when a negative voltage is applied, it is reset at about −0.8V to show a high resistance state. This could be a typical hysteresis loop of a bipolar resistance variable memory device.

FIGS. 9A, 9B, and 9C are graphs illustrating I-V characteristics of selection devices including polycrystalline $Ta_2O_5$ layers according to Preparation Examples 1 to 3, respectively.

Referring to FIGS. 9A, 9B, and 9C, the selection devices according to Preparation Examples 1 to 3, unlike the hysteresis curve of FIG. 8, have a positive turn-on voltage and a negative turn-on voltage, and after being turned on, a current tends to increase linearly.

This is due to the heat treatment process performed in Preparation Examples. In this heat treatment process, the $Ta_2O_5$ layer is crystallized and changed into a polycrystalline film including a plurality of grains and unstable grain boundaries therebetween, and also Ta atoms or Ta ions in the lower Ta layer are diffused through the Pt layer and entered into grain boundaries in the $Ta_2O_5$ layer to form nanochannels.

Specifically, it can be seen that the selection device according to Preparation Example 1 shown in FIG. 9A is turned on at about 1V when a positive voltage is applied and is turned on at about −0.1V when a negative voltage is applied, the selection device according to Preparation Example 2 as shown in FIG. 9B is turned on at about 1.2V when a positive voltage is applied and is turned on at about −0.3V when a negative voltage is applied, and the selection device according to Preparation Example 3 shown in FIG. 9C is turned on at about 2V when a positive voltage is applied and is turned on at about −0.4V when a negative voltage is applied. In addition, the selection devices according to Preparation Examples 1 to 3 exhibit a leakage current or off current of $1 \times 10^{-11}$ A or less, further $5 \times 10^{-11}$ A or less in the turn-off state, and the turned-off section is 1V or more or 0.5V or more and 5V or less, for example, it is less than 3V.

Figure 10:
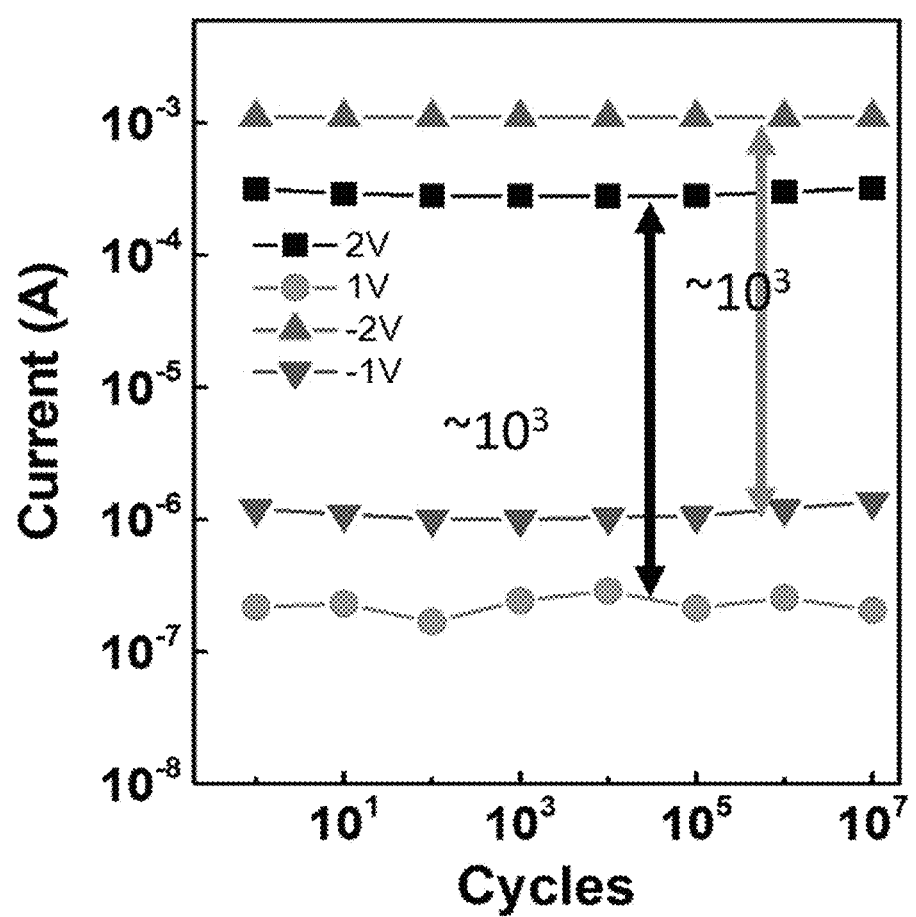
FIG. 10 is a graph showing I-V characteristics of the selection device having the polycrystalline metal oxide layer according to Preparation Example 1 measured $10^7$ times.

FIG. 10 is a graph showing I-V characteristics of the selection device having the polycrystalline metal oxide layer according to Preparation Example 1 measured $10^7$ times. To measure I-V characteristics, a voltage sweep of −2V to 2V was applied to the device, and currents were measured at −2V, −1V, 1V, and 2V.

Referring to FIG. 10, it is shown that the current value at 2V and the current value at 1V, which is a half of 2V, have a ratio of about $10^3$, and the current value at −2V and the current value at −1V, which is half of −2V, also have a ratio of about $10^3$. From these results, when the selection device according to the present embodiment is applied to the crosspoint memory as shown in FIG. 4, a large difference in current values according to the read voltage and ½ read voltage can be induced, so that the read margin can be predicted to increase significantly.

In addition, current values measured while measuring the I-V characteristics $10^7$ times appeared to be almost constant, indicating that the reliability of the selection device according to the present embodiment was very good.

<Device Including $HfO_2$ Film>

Preparation Examples 7-14

A Hf layer was formed to about 10 nm by sputtering on a silicon substrate on which a silicon oxide film was formed, and a Pt layer as a diffusion control layer was formed on the Hf layer by sputtering to a thickness of about 20 nm, and a $HfO_2$ layer as a metal oxide layer was formed on the Pt layer by sputtering to a thickness of about 20 nm. The substrate on which the $HfO_2$ layer was formed was heated to the temperature shown in Table 2 for 30 minutes and then maintained for about 1 hour to perform heat treatment in an Ar atmosphere. After that, it was cooled naturally. A Ta layer with a thickness of about 20 nm was formed on the heat-treated $HfO_2$ layer by sputtering to prepare a selection device.

Comparative Example 3

A selection device was prepared in the same manner as in Preparation Example 7, except that the $HfO_2$ layer was not heat-treated and a Ta layer was formed on the non-heat-treated $HfO_2$ layer.

TABLE 2

|  | Metal Oxide Layer | Heat Treatment Temperature |
|---|---|---|
| Preparation Example 7 | $HfO_2$ 20 nm | 375° C. |
| Preparation Example 8 | $HfO_2$ 20 nm | 400° C. |
| Preparation Example 9 | $HfO_2$ 20 nm | 425° C. |
| Preparation Example 10 | $HfO_2$ 20 nm | 450° C. |
| Preparation Example 11 | $HfO_2$ 20 nm | 475° C. |
| Preparation Example 12 | $HfO_2$ 20 nm | 500° C. |
| Preparation Example 13 | $HfO_2$ 20 nm | 600° C. |
| Preparation Example 14 | $HfO_2$ 20 nm | 700° C. |
| Comparative Example 3 | $HfO_2$ 20 nm | — |

Figure 11:
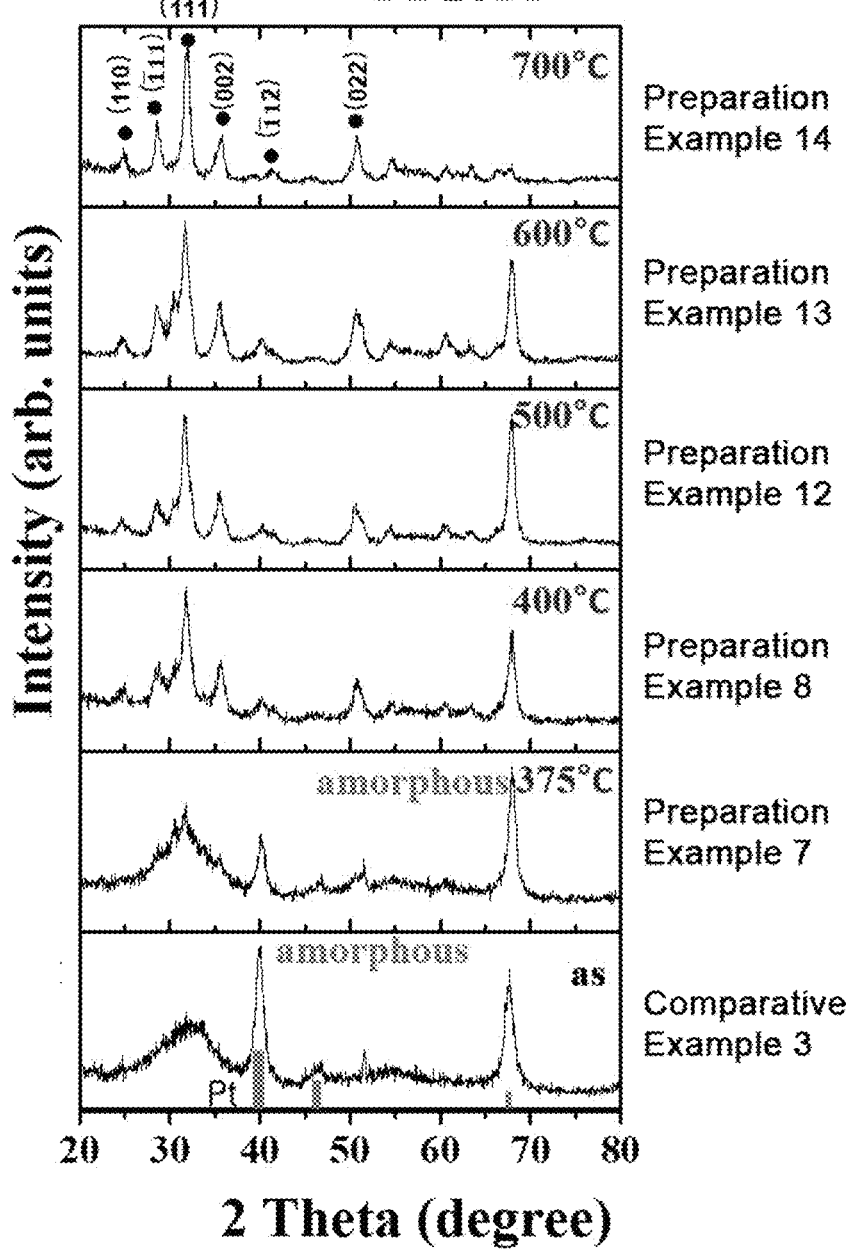
FIG. 11 shows XRD (X-Ray Diffraction) graphs for the $HfO_2$ layer obtained during the device preparatin process according to Comparative Example 3 and Preparation Examples 7, 8, and 12-14.

FIG. 11 shows XRD (X-Ray Diffraction) graphs for the $HfO_2$ layer obtained during the device preparatin process according to Comparative Example 3 and Preparation Examples 7, 8, and 12-14.

Referring to FIG. 11, the $HfO_2$ layer that is not heat treated (Comparative Example 3) shows only a peak corresponding to the lower Pt layer, indicating that the $HfO_2$ layer according to Comparative Example 3 is amorphous. On the other hand, it can be seen that, when the heat treatment temperature is 400° C. or higher, the $HfO_2$ layer is crystallized to form a polycrystalline film (Preparation Examples 8 and 12-14). Meanwhile, in the present embodiment, it can be seen that the polycrystalline $HfO_2$ layer shows the intensity of the peak corresponding to (111) is greater than the intensity of the peak corresponding to (−111).

Figure 12:
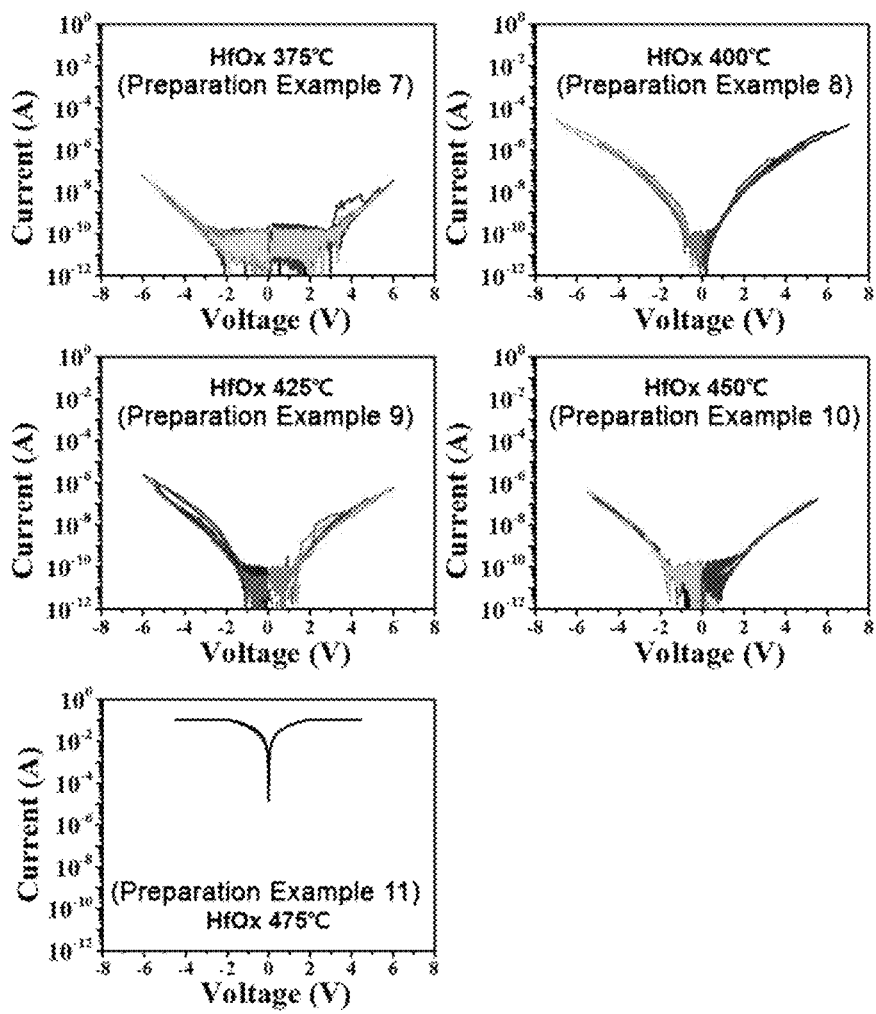
FIG. 12 shows graphs showing I-V characteristics of selection devices according to Preparation Examples 7 to 11.

FIG. 12 shows graphs showing I-V characteristics of selection devices according to Preparation Examples 7 to 11.

Referring to FIGS. 11 and 12, the selection devices (Preparation Examples 8-10) having a polycrystallized $HfO_2$ layer heat-treated at 400° C. or higher show a positive turn-on voltage of 2V or less and a negative turn-on voltage, and show that the current increases linearly after being turned-on and the slope at which the current increases is relatively large. On the other hand, it can be seen that the selection device (Preparation Example 7) including the non-polycrystallized $HfO_2$ layer shows a very large turn-on voltage of 2V or more, and shows that the current increase slope after being turned-on is not large. On the other hand, it was found that the $HfO_2$ layer heat-treated at 475° C. or higher (Preparation Example 11) was difficult to serve as a selection device.

In the above, the present invention has been described in detail with reference to preferred embodiments, but the present invention is not limited to the above embodiments, and various modifications and changes by those skilled in the art is possible within the spirit and scope of the present invention.

The invention claimed is:

1. A method for manufacturing a selection device comprising:
sequentially forming a metal layer, a diffusion control layer, and a metal oxide layer on a substrate, wherein the metal layer is a layer of the same metal as a metal included in the metal oxide layer and the diffusion control layer is an inert metal layer or a metal compound layer which is inert;
heat-treating the substrate on which the metal oxide layer is formed in an inert gas atmosphere to crystallize the metal oxide layer to obtain a polycrystalline layer having a plurality of crystal grains and a grain boundary therebetween, and to diffuse the metal in the metal layer through the diffusion control layer into to the grain boundary thereby forming a conductive nanochannel; and
forming an upper electrode on the heat-treated metal oxide layer,
wherein the crystal grains are crystal grains of $Ta_2O_5$ and the metal layer under the diffusion control layer is a Ta layer; or wherein the crystal grains are crystal grains of $HfO_2$ and the metal layer under the diffusion control layer is a Hf layer.

* * * * *